US006349792B1

(12) United States Patent
Smith, Jr. et al.

(10) Patent No.: US 6,349,792 B1
(45) Date of Patent: Feb. 26, 2002

(54) SOUND ENHANCING SPEAKING CABINET FOR A REMOVABLE SPEAKER ASSEMBLY

(76) Inventors: Harold N. Smith, Jr.; Harold N. Smith, III, both of 3411 Loblolly La., Spring, TX (US) 77380

( * ) Notice: Subject to any disclaimer, the term of this patent is extended or adjusted under 35 U.S.C. 154(b) by 0 days.

(21) Appl. No.: 09/544,227

(22) Filed: Apr. 7, 2000

(51) Int. Cl.[7] .................................................. H05K 5/00

(52) U.S. Cl. ....................... 181/156; 181/152; 181/199; D14/214

(58) Field of Search ................................ 181/156, 155, 181/154, 152, 179, 182, 183, 185, 189, 192, 199; D14/204, 210, 213–216; 381/332–340, 349, 345, 352, 386–388

(56) References Cited

U.S. PATENT DOCUMENTS

| | | | | |
|---|---|---|---|---|
| 2,642,948 A | | 6/1953 | Olson et al. | |
| 2,649,264 A | * | 8/1953 | Olson et al. | 181/31 |
| 2,751,997 A | | 6/1956 | Gately, Jr. | |
| 2,975,852 A | | 3/1961 | Chave | |
| 3,151,699 A | * | 10/1964 | Peavey | 181/31 |
| 3,730,291 A | | 5/1973 | Goeckel | |
| 3,819,006 A | | 6/1974 | Westlund | |
| 3,882,962 A | | 5/1975 | Ripple | |
| 3,980,154 A | | 9/1976 | Johnson | |
| D256,118 S | | 7/1980 | Kornblum | |
| 4,592,444 A | * | 6/1986 | Perrigo | 181/151 |
| D313,022 S | | 12/1990 | Flanders | |
| D313,599 S | | 1/1991 | Flanders | |
| D316,862 S | | 5/1991 | Flanders | |
| 5,296,656 A | * | 3/1994 | Jung | 181/152 |
| 5,550,921 A | * | 8/1996 | Freadman | 381/24 |
| 5,825,900 A | * | 10/1998 | Jeon | 381/154 |
| 6,012,542 A | * | 1/2000 | Accordino | 181/199 |

* cited by examiner

*Primary Examiner*—Robert E. Nappi
*Assistant Examiner*—Edgardo San Martin
(74) *Attorney, Agent, or Firm*—William W. Haefliger

(57) ABSTRACT

A sound enhancer for use with a speaker assembly having front and rear sides, comprising an enclosure forming first and second hollow portions, the enclosure defining a cradling zone to receive the speaker assembly in an angularly cradled position; the first hollow portions defining an inlet to directly receive sound transmitted from the rear side of the speaker assembly, in a direction opposite to sound transmission from the front side of the speaker assembly; and the enclosure hollow portions having walls to re-direct sound received by the enclosure first hollow portion into the enclosure second hollow portion, and then toward an outlet defined by enclosure second hollow portions. A doubled-up, series megaphone effect is achieved.

14 Claims, 1 Drawing Sheet

SOUND ENHANCING SPEAKING CABINET FOR A REMOVABLE SPEAKER ASSEMBLY

BACKGROUND OF THE INVENTION

Figure 1:
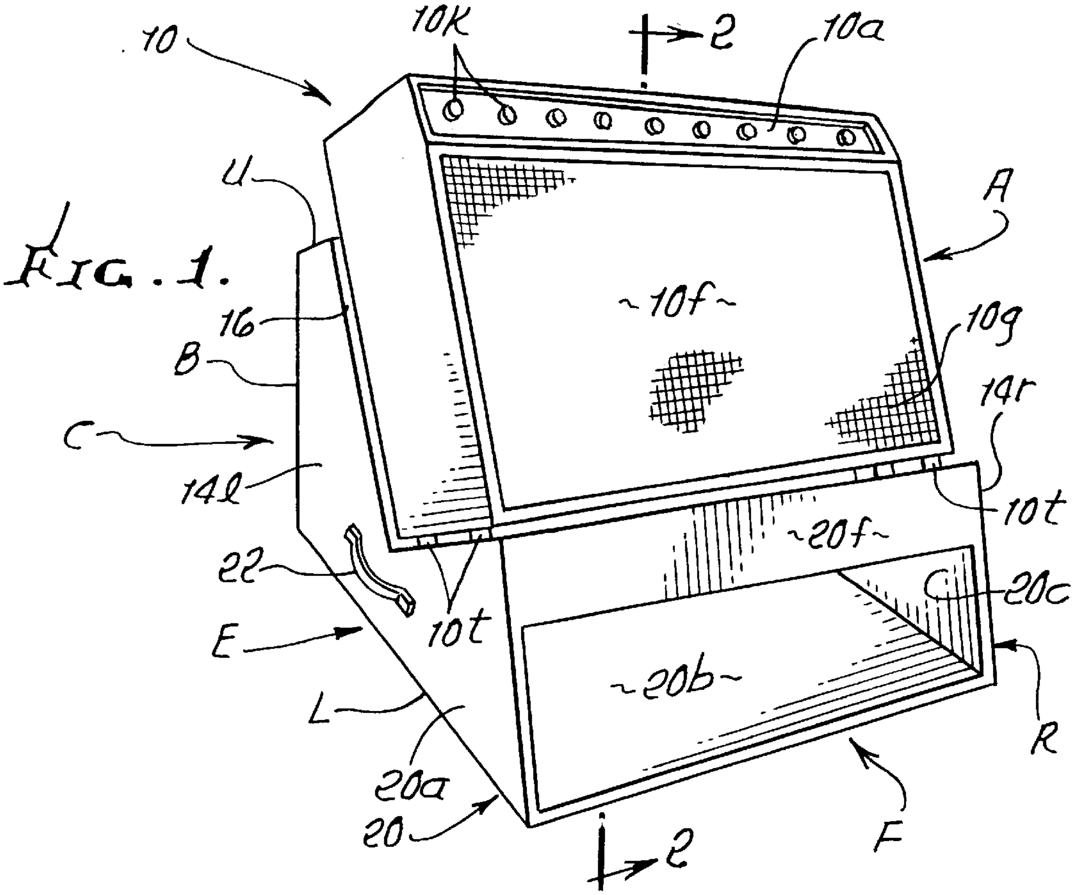

The present invention relates generally to the field of loud speaker equipment and more particularly to a sound enhancing speaker cabinet for removable speaker assemblies.

Portable speaker equipment, particularly amplifiers for electronic amplification of musical instruments, have been produced with acoustical speakers mounted in speaker enclosures. Of particular concern are guitar amplifiers used to amplify electric guitar music. These amplifiers or speaker assemblies are often two to three feet high and are positioned on the ground or on the stage behind a musician. The front of the speaker enclosure generally has an opening through which the speaker transmits or directs the primary portion of the acoustic energy and a substantially open rear wall through which a secondary portion of the acoustical energy is directed. Normally the speaker assembly directs the sound along a horizontal axis toward or pointed at the audience; while the secondary portion of the acoustical energy is directed away from the audience with this energy being essentially lost or wasted.

A frequent problem for the performing musician is that it is difficult to hear oneself playing with the typical loud speaker equipment. Since the speaker assemblies are generally two to three feet tall and are placed on the ground level behind the musician, the primary portion of the sound is directed horizontally about the knee-level of the musician. This results in too little sound reaching the height of the musician's ears for monitoring.

The present invention is a speaker cabinet for positioning a typical speaker assembly having such an open back. The present speaker cabinet captures the secondary portion of the acoustical energy and redirects it in the desired direction. Additionally, the speaker assembly is slanted upwardly to allow the performing musician to better hear himself.

SUMMARY OF THE INVENTION

The present invention redirects the secondary portion of an audio output from a removable speaker assembly of the type having a speaker housing or enclosure with a front side though which a primary portion of the audio output from at least one acoustic device or speaker enclosed in the housing is directed and with a substantially open rear side opposite the front side through which the secondary portion of the audio output is transmitted. An enclosure is formed having front and back sides, upper and lower sides, and side walls. The enclosure has a substantially hollow interior. Positioning means with the front side of the enclosure removably maintains the rear side of the removable speaker assembly adjacent a first side of the front side of the enclosure. Sound transmitting means with the first area of the front side of the enclosure communicates the secondary portion of the audio output from the removable speaker assembly into the hollow interior of the enclosure. Redirecting means communicates with the hollow interior of the enclosure for directing the secondary portion of the audio output from the interior essentially in the direction of the primary portion of the audio output from the removable speaker assembly. The speaker assembly is typically cradled above hollow interiors of the enclosure that form successively divergent sound transmitting zones to re-direct sound with a doubled-up series megaphone effect.

These and other objects and advantages of the invention, as well as the details of an illustrative embodiment, will be more fully understood from the following specification and drawings, in which:

DRAWING DESCRIPTION

Figure 2:
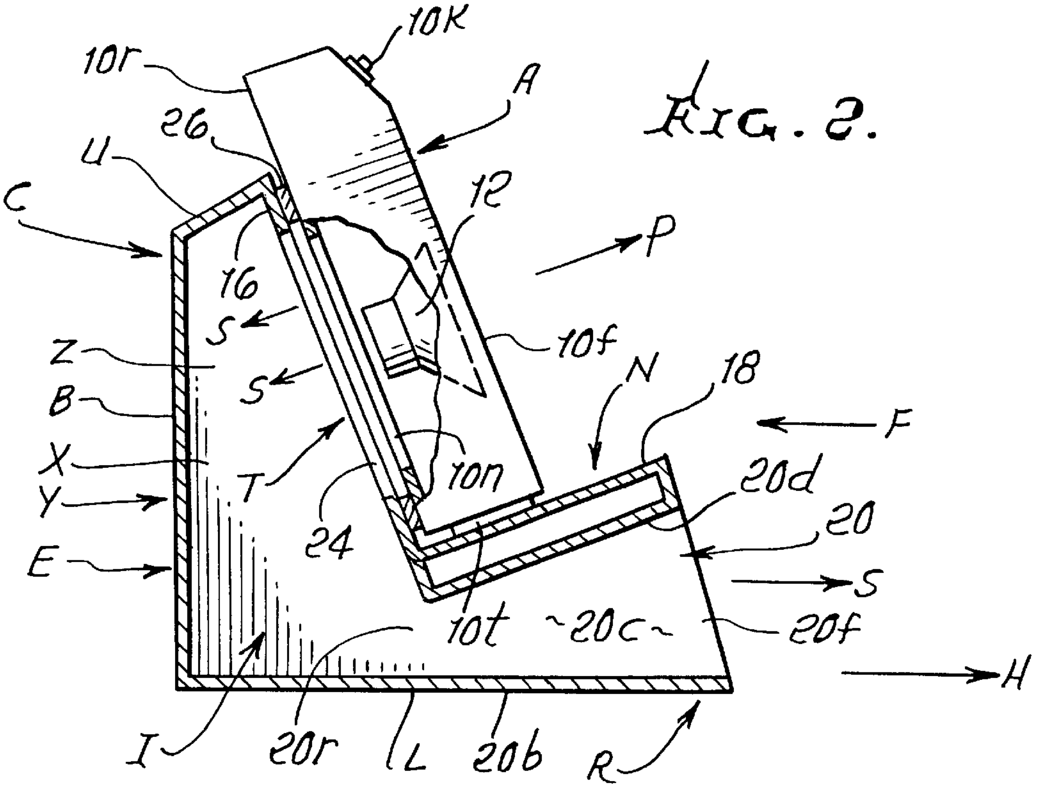

FIG. 1 is a perspective view of the present invention with a removable speaker assembly; and FIG. 2 is a cross-sectional view taken along line 2—2 of FIG. 1.

DETAILED DESCRIPTION

A sound enhancing cabinet C is adapted to redirect a secondary portion S of an audio output from a removable speaker assembly A of the type having a speaker housing 10 with a front side **10*f* through which side 10*f* a primary portion P of the audio output from at least one acoustic device 12 enclosed in the housing 10 is directed. The sound enhancing cabinet C includes an enclosure E formed to have a front side F and back side B, an upper side U and lower side L, and side walls or panels 14*r* and 14*l*. The enclosure E has a substantially hollow interior I. Positioning means N together with the front side F of the enclosure E removably maintains a rear side 10*r* of the speaker assembly A adjacent a first area 16 of the front side F of the enclosure E. Sound transmitting means T with the first area 16** of the front side F communicates the secondary portion S of the audio output from the removable speaker assembly A into the hollow interior I. Redirecting means R communicates with the hollow interior I for directing the secondary portion S of the audio output from the interior I toward a desired direction.

The removable speaker assembly or amplifier A typically has a speaker housing or enclosure 10 with a front side **10*f* and a rear side 10*r*. At least one acoustical device or speaker 12 is mounted within the speaker housing 10 and when energized directs a primary portion P of the audio output through the front side 10*f* of the speaker housing 10. The rear side 10*r* is substantially open and a secondary portion S of the audio output passes through the opening 10*n*** in a direction generally opposite that of the primary portion P.

The speaker assembly A includes an electronic amplifier **10*a* with adjusting knobs 10*k* to amplify the electrical signals from musical instruments. Feet lot may be provided for support of the speaker assembly A. The front 10*f* of the speaker assembly 10*a* may be covered with a grille-cloth 10*q* to cover the speaker 12** while allowing the passage of the audio energy through the cloth without substantial degradation of the audio output.

The sound enhancing cabinet C includes the enclosure E formed to have panels defining a front side F, back side B, upper side U, lower side L and two side walls **14*r* and 14*l***. The enclosure E has a substantially hollow interior I.

The positioning means N with the front side F of the enclosure E removably maintains the rear side **10*r* of the speaker assembly A adjacent a first area 16 of the front side E of the enclosure E. Preferably, positioning means N maintains the removable speaker assembly A in a slanted or cradled position whereby the speaker assembly A directs the primary portion P of the audio output above a horizontal axis H. Referring to FIG. 2 the arrow H shows the horizontal axis relative to the sound enhancing cabinet C, and the arrow P generally depicts the direction in which the speaker 12** points or directs the primary portion P of the audio output.

The sound transmitting means T (FIG. 2) with the first area 16 of the front side F of the enclosure E communicates the secondary portion S of the audio output from the removable speaker assembly A into the hollow interior I of the enclosure E. Preferably the narrowed upper extent of the sound transmitting means T is an aperture or opening 24 formed in the first area 16 of the front side 10*f* of the enclosure E. Aperture 24 and opening 10*n* of speaker assembly A are of complementary sizes such that when speaker assembly A is cradle-positioned on the sound enhancing cabinet C, essentially all of the secondary portion of the audio output is communicated rearwardly and downwardly into the interior I of the enclosure E. A strip 26 attached to the side of the first area 16 adjacent speaker assembly A extends around opening 24 to cushion the speaker assembly A against the front side F of the enclosure E. The strip 216 also acts as a sound seal between the enclosure E and the speaker assembly A.

The redirecting means R communicates with the hollow interior I of the enclosure E for directing the secondary portion S of the audio output from the interior I essentially in the direction of the primary portion P of the audio output from the removable speaker assembly A. Rear wall panel B reflects sound downwardly and forwardly, toward bottom wall panel L from which sound waves are directed forwardly to exit at 20*f*. Referring to FIG. 2, the arrow 5 representing the secondary portion of the audio output exiting from the redirecting means R is essentially parallel to the horizontal axis H, and generally in the same direction as the primary audio output portion P, although it is to be recognized that the primary portion may point or be directed above the horizontal axis H.

Preferably, the positioning means N is a shelf 18 extending from the front side F of the enclosure E. The shelf 18 should be of suitable dimensions and angled to adequately support the speaker assembly A while positioning the speaker assembly A in the desired placement adjacent the first area 16 of the front side F of the enclosure E. Angular cradling of the assembly A causes weight exertion against cushion strip 26 about the opening 24, for sound sealing. In FIG. 1, redirecting means R is a duct 20 having panel sides 20*a, b, c* and *d* for channeling the secondary portion S of the audio output from the interior I through narrowed rear opening 20*r* and enlarged front opening 20*f*. The shelf 18 may form the upper side 20*d* of the duct 20. Alternatively, if shelf 18 and upper side 20*d* are separate, face plate 20*f* forms a frontal piece bridging the gap between shelf 18 and upper side panel 20*b*. Upper side 20*d* may be formed either curved or straight. In FIG. 2, the lower side L is shown extended to form the bottom wall 20*b* of duct 20. Duct interior 20*c* diverges forwardly from a narrowed region to provide a megaphone sound effect. Note also that the hollow interior X of enclosure first portion Y diverges downwardly from a narrowed region Z to produce a first megaphone effect, and that coupled with the megaphone effect of duct interior 20*c* produces a doubled-up, and series megaphone, sound enhancing effect. Angled stabilized cradling of the speaker assembly A contributes to enclosure panel formation of megaphone regions X and 20*c*.

Handle 22 is shown attached to side 141 enclosure E in FIG. 1 to assist in transporting the present invention.

In construction of the present invention, it is contemplated to employ sheet or panel material for the wall elements and while this sheet material may be a variety of types, including plastic materials, it is preferred to employ a relatively thin plywood of the order of ⅛ to ½ inch thickness. The construction further contemplates that all the joints may be adhesively bonded, for instance with epoxy type adhesive. The strip 26 generally is a felt cloth stripping, or equivalent, affixed to the side of first area 16 adjacent the speaker assembly A.

Although some openings other than openings 24, 20*r* and 20*f* could be provided in the enclosure, it is preferred to provide an enclosure which has substantially no other openings.

The present invention may be arranged to accommodate speaker assemblies of various kinds and sizes. Preferably the dimensions of aperture 24 and shelf 18 are suitable for the selected speaker assembly A.

Operation

In operation of the present invention a selected speaker assembly A is placed upon shelf 18 with the rear side 10*r* of the speaker assembly adjacent the first area 16 of the front side F of the enclosure E. The opening 10*n* in speaker assembly A should be adjacent the aperture 24 in the first area 16 of the enclosure E. The primary portion P of the audio output generated by the speaker 12 is pointed in the desired direction determined by the angle at which support shelf 18 is slanted above the horizontal axis H. The secondary portion S of the audio output is communicated first through the opening 10*n* in the rear side 10*r* of the speaker assembly A then through the aperture 24 into the interior I of enclosure E. The secondary portion S of the audio output is then reflected in the interior I against the various walls such as the back B, and sides 14*l* and 14*r*. The secondary portion S of the audio output is then communicated through the rear opening 20*r* of the duct 20 and finally exits forwardly from opening 20*f* of duct 20 being directed in generally the same direction as the primary portion P of the audio output. As referred to, a doubled, i.e. sequential series dual megaphone effect is achieved, associated with positioning, such as angular cradling, of the speaker assembly. A sound amplification enhancement effect can thereby be achieved. From the foregoing, it will be noted that the hollow interior of the enclosure or cabinet includes or defines first and second hollow portions defining sequentially related megaphones; each megaphone flaring from a narrow region; the narrow region of one megaphone (region Z, for example) located adjacent the sound input opening 24; and the one megaphone flaring toward the narrow region of the other megaphone (20*c* for example). A shelf 18 is enabled to be above the narrowed region of megaphone 20*c*, and with angularity due to that narrowed region to provide cradling for the speaker assembly adjacent both megaphones, for a highly compact, and sound producing efficient, assembly.

Alternative Embodiment

FIGS. 1 and 2 show the redirecting means R beneath the positioning means N. Alternatively, redirecting means may be placed or located above or to either side of the amplifier or speaker assembly A as long as the sound enhancing cabinet C captures the secondary portion S of the audio output from the speaker assembly A and redirects the secondary portion S in the desired direction.

Yet another alternative embodiment is forming a bulbous or rounded shaped back side B of the enclosure E which would function as the upper side U and the back B. Such a bulbous back B may also be formed to include the side walls 14*l* and 14*r* in a single curved segment.

With the present invention, the secondary portion S of the audio output which has heretofore been lost is now captured and redirected toward the desired location, such as toward an audience. Having the speaker assembly A maintained in a slanted position improves the level of the sound being transmitted fowardly and upwardly to the musical performer, for monitoring the speaker assembly A without sound loss to the audience direction or volume.

By placing an amplifier or speaker assembly A onto the sound enhancing cabinet C of the present invention, the lower and higher frequency responses are expanded for detection.

The foregoing disclosure and description of the invention are illustrative and explanatory thereof, and various changes in the size, shape and materials, as well as in the details of the illustrated construction maybe made without departing from the spirit of the invention.

We claim:

1. A sound enhancing enclosure adapted for redirecting a secondary portion of an audio output from a speaker assembly of the type having at least one acoustic device with one side from which a primary portion of the audio output is directed, and a second side from which a secondary portion of the audio output is directed, the speaker assembly including an opening through which the secondary portion of the audio output is transmitted, the invention comprising:

a) an enclosure having a substantially hollow interior with an input opening adapted to communicate with the speaker assembly opening for receiving the secondary portion of the audio output of the audio device, b) positioning means for positioning the speaker assembly relative to the enclosure so that the primary portion of the audio output is directed away from the enclosure and the secondary portion of the audio output is transmitted from the speaker assembly opening, through the input opening and into the hollow interior, c) the enclosure including a sound redirecting panel or panels and an output opening communicating with said hollow interior for receiving and directing the secondary portion of the audio output from said interior and through the output opening toward a desired direction, d) said hollow interior including first and second hollow portions defining sequentially related megaphones, each megaphone flaring from a narrow region, the narrow region of one megaphone located adjacent said input opening, and the one megaphone flaring toward the narrow region of the other megaphone.

2. The invention of claim 1 wherein said desired direction is generally in the direction of the primary portion of the audio output from the speaker assembly.

3. The invention of claim 1 wherein said positioning means maintains the speaker assembly in a slanted position relative to vertical and above the second megaphone whereby the speaker assembly directs the primary portion of the audio output above a horizontal axis.

4. The invention of claim 1 wherein said positioning means includes an angled shelf extending from said front side of said enclosure for removably supporting the speaker assembly in a cradled position and urged by gravity toward said input opening.

5. The invention of claim 3 wherein said second megaphone extends toward said front side of said enclosure, in a forward direction, said second megaphone diverging in that direction.

6. The invention of claim 4 wherein said shelf extends at the upper side of said second megaphone, said first megaphone extending vertically and said second megaphone extending horizontally.

7. The invention of claim 5 wherein said shelf maintains the removable speaker assembly slanted from a vertical axis, and the second megaphone directs the secondary portion of the audio output along a generally horizontal axis.

8. The invention of claim 4 including a seal extending about said input opening and compressed by weight exerted by the cradled speaker assembly.

9. A sound enhancer for use with a speaker assembly having front and rear sides, comprising a) an enclosure forming first and second hollow portions, the enclosure defining a zone to receive the speaker assembly in a supported position, b) the first hollow portion receiving sound transmitted from the rear side of the speaker assembly, in a direction opposite to sound transmission from the front side of the speaker assembly, c) the enclosure hollow portions having walls to re-direct sound received by the enclosure first hollow portion into the enclosure second hollow portion, and then toward an outlet defined by the enclosure second hollow portion, d) both of said hollow portions diverging in the sound transmission direction and from narrowest regions to produce a sound enhancing sequential series dual megaphone effect, said first hollow portion diverging downwardly, and said second hollow portion diverging generally forwardly below the level of said speaker assembly.

10. A sound enhancer for use with a speaker assembly having front and rear sides, comprising a) an enclosure forming first and second hollow portions, the enclosure defining a cradling zone to receive the speaker assembly in a supported position, b) the first hollow portion receiving sound transmitted from the rear side of the speaker assembly, in a direction opposite to sound transmission from the front side of the speaker assembly, c) the enclosure hollow portions having walls to re-direct sound received by the enclosure first hollow portion into the enclosure second hollow portion, and then toward an outlet defined by the enclosure second hollow portion, d) said cradling zone being proximate said first and second hollow portions, and in an angled space formed between said first and second hollow portions, e) and wherein at least one of said first and second hollow portions diverges in the sound transmission direction or directions to produce at least one sound enhancing megaphone effect.

11. The sound enhancer of claim 9 wherein the enclosure supports the speaker assembly in a cradled position.

12. The sound enhancer of claim 11 wherein said cradled position subtends said enclosure first and second hollow portions.

13. The sound enhancer of claim 11 including a cushioning seal extending about said inlet to receive compression force exerted by said speaker assembly in angularly cradled position.

14. The sound enhancer of claim 12 including the speaker assembly received in said zone and cradled by the enclosure in a tilted position.

* * * * *

UNITED STATES PATENT AND TRADEMARK OFFICE
CERTIFICATE OF CORRECTION

PATENT NO. : 6,349,792 B1
DATED : February 26, 2002
INVENTOR(S) : Harold N. Smith, Jr. and Harold N. Smith, III It is certified that error appears in the above-identified patent and that said Letters Patent is hereby corrected as shown below:

Title page,
Item [54], "SOUND ENHANCING SPEAKING CABINET FOR A REMOVABLE SPEAKER ASSEMBLY" should read -- SOUND ENHANCING SPEAKER CABINET FOR A REMOVABLE SPEAKER ASSEMBLY --

Signed and Sealed this

Seventh Day of May, 2002

*Attest:*

JAMES E. ROGAN
*Director of the United States Patent and Trademark Office*

*Attesting Officer*